United States Patent
Im et al.

(10) Patent No.: US 8,076,837 B2
(45) Date of Patent: Dec. 13, 2011

(54) ORGANIC LIGHT EMITTING DISPLAY DEVICE AND METHOD OF FABRICATING THE SAME

(75) Inventors: Choong-Youl Im, Suwon-si (KR); Kyung-Jin Yoo, Suwon-si (KR); Woo-Sik Jun, Suwon-si (KR); Do-hyun Kwon, Suwon-si (KR); Tae-Wook Kang, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 970 days.

(21) Appl. No.: 11/517,277

(22) Filed: Sep. 8, 2006

(65) Prior Publication Data

US 2007/0052352 A1  Mar. 8, 2007

(30) Foreign Application Priority Data

Sep. 8, 2005  (KR) .................. 10-2005-0083853

(51) Int. Cl.
*H01L 51/00* (2006.01)
(52) U.S. Cl. ........................ 313/504; 313/506
(58) Field of Classification Search .......... 313/504, 313/506, 512; 257/40
See application file for complete search history.

(56) References Cited

U.S. PATENT DOCUMENTS

| 2003/0151358 A1* | 8/2003 | Iga ............................... 313/506 |
| 2003/0164496 A1* | 9/2003 | Do et al. ......................... 257/40 |
| 2005/0067953 A1* | 3/2005 | Yamazaki et al. ............ 313/506 |
| 2005/0236620 A1* | 10/2005 | Yamada .......................... 257/59 |
| 2005/0287392 A1* | 12/2005 | Toyoda ........................ 428/690 |
| 2006/0006540 A1* | 1/2006 | Park et al. ..................... 257/758 |
| 2006/0062270 A1* | 3/2006 | Okutani et al. ............... 372/64 |
| 2006/0131586 A1* | 6/2006 | Kim et al. ...................... 257/72 |

* cited by examiner

*Primary Examiner* — Karabi Guharay
(74) *Attorney, Agent, or Firm* — H.C. Park & Associates, PLC

(57) ABSTRACT

An organic light emitting display device (OLED) and a method of fabricating the same. The OLED includes: a substrate; a thin film transistor on the substrate and including a source electrode and a drain electrode; a first insulating layer on the substrate having the source and drain electrodes; a second insulating layer on the first insulating layer and including a trench; a via hole formed in the trench over the first and second insulating layers and exposing a portion of the source electrode or the drain electrode; a first electrode in the trench and connected to one of the source electrode and the drain electrode through the via hole; a pixel defining layer on the first electrode and having an opening exposing the first electrode; an organic layer in the opening and having at least an organic emission layer; and a second electrode on an entire surface of the substrate having the organic layer.

16 Claims, 2 Drawing Sheets

ORGANIC LIGHT EMITTING DISPLAY DEVICE AND METHOD OF FABRICATING THE SAME

CROSS-REFERENCE TO RELATED APPLICATIONS

This application claims the benefit of Korean Application No. 2005-83853, filed Sep. 8, 2005, in the Korean Intellectual Property Office, the disclosure of which is incorporated herein by reference.

BACKGROUND OF THE INVENTION

1. Field of the Invention

Aspects of the present invention relate to an organic light emitting display device (OLED) and a method of fabricating the same, and more particularly, to an OLED and a method of fabricating the same, which can maximize transfer efficiency in formation of an organic layer by a laser induced thermal imaging (LITI) method and minimize pixel shrinkage caused by outgassing.

2. Description of the Related Art

The OLED, among flat panel display devices, is a self-emissive display device emitting light by electrically exciting an organic compound. The OLED can be made lightweight and thin because it does not need a backlight used in an LCD, and can also be made at a low temperature by simple processes. Additionally, the OLED has a high response speed of 1 ms or less, low power consumption, a wide viewing angle, and high contrast.

The OLED includes an organic emission layer between an anode and a cathode, where a hole supplied by the anode and an electron supplied by the cathode combine in the organic emission layer to form an unstable hole-electron pair called an exciton which emits light by decaying.

OLEDs are classified into a bottom-emission type and a top-emission type depending on a direction from which light is emitted from the organic emission layer. If an OLED having a pixel driving circuit disposed therein is a bottom-emission type, an aperture ratio is significantly restricted by the large area of the substrate occupied by the pixel driving circuit. Thus, the top-emission type OLED has been introduced in order to enhance the aperture ratio.

FIG. 1 is a cross-sectional view of a conventional top-emission type OLED. Referring to FIG. 1, a buffer layer 110 is formed on a substrate 100 formed of glass or plastic. A thin film transistor including a semiconductor layer 120 having source and drain regions 120a and 120c and a channel region 120b, a gate insulating layer 130 and a gate electrode 140, is formed on the buffer layer 110.

An interlayer insulating layer 150 is formed on the entire surface of the substrate including the thin film transistor. Then, contact holes 155a and 155b are formed in the interlayer insulating layer 150 and the gate insulating layer 130 to expose portions of the source and drain regions 120a and 120c.

Source and drain electrodes 160a and 160b are formed to be electrically connected to the source and drain regions 120a and 120c through the contact holes 155a and 155b. A planarization layer 170 is formed on the entire surface of the substrate including the source and drain electrodes 160a and 160b. A via hole 175 is formed in the planarization layer 170 to expose a portion of the drain electrode 160a.

Next, a first electrode 180 contacting the drain electrode 160a through the via hole 175 is formed on the entire surface of the substrate. The first electrode 180 is a transparent electrode and includes an underlying reflective layer.

A pixel defining layer 190 is formed on the first electrode 180. The pixel defining layer is formed of an organic material, to a thickness of about 0.5 to 1 μm, and patterned to include an opening 200 exposing the first electrode 180. An organic layer (not illustrated) is formed on the first electrode. The organic layer includes at least an organic emission layer and may further include at least one of a hole injection layer, a hole transport layer, an electron transport layer and an electron injection layer. A second electrode (not illustrated) is formed on the entire surface of the substrate including the organic layer, and thus an OLED is completed.

The planarization layer removes a step of a pixel region in the top-emission OLED and is mainly formed of an organic material such as polyimide. Such a planarization layer can damage the organic layer due to outgassing, and thereby cause pixel shrinkage. Also, when the planarization layer formed of the organic material is combined with an encapsulated substrate, a bonding force decreases, thereby allowing air and moisture to penetrate from the outside, decreasing a device's lifespan.

Meanwhile, in the conventional OLED, the first electrode is formed to protrude from the surface of the planarization layer, thereby generating a step, and thus the following pixel defining layer should be thickly formed to surround an edge of the first electrode.

Here, due to the step between the thickly formed pixel defining layer and the first electrode, when the organic layer is formed by a laser induced thermal imaging (LITI) method, transfer efficiency decreases and deterioration of the organic layer is accelerated. In particular, since the organic layer is not transferred well at an edge part of the opening and tends to get cut off, an opening defect may occur.

However, when the pixel defining layer is formed of a thin organic layer which is about 2000 Å in thickness to improve the organic layer transfer efficiency, then when a transfer layer of a donor substrate is removed after forming the organic layer on the opening of the first electrode, the pixel defining layer may also be lifted off. This generates a short circuit between the first and second electrodes and causes unevenness and non-uniform dispersion when stacking the pixel defining layer.

Also, to exacerbate such a problem, when the pixel defining layer is an inorganic layer having a thickness of about 1000 Å, the inorganic material is incapable of fully filling a via hole. Alternatively, when the thickness of the inorganic layer is increased, a crack is generated at the edge of the first electrode and the periphery of the via hole owing to stress. Particularly, since the inorganic material has poor step coverage, the crack at the edge of the first electrode is caused by the step between the first electrode and the planarization layer, and thus a short circuit may be generated between the first and second electrodes.

SUMMARY OF THE INVENTION

Aspects of the present invention provide an organic light emitting display device (OLED) and a method of fabricating the same, which can maximize transfer efficiency and minimize a pixel shrinkage phenomenon caused by outgassing in the formation of an organic layer by a laser induced thermal imaging (LITI) method.

In an exemplary embodiment of the present invention, an OLED includes: a substrate; a thin film transistor disposed on the substrate and including a source electrode and a drain electrode; a first insulating layer disposed on the substrate having the source and drain electrodes; a second insulating layer disposed on the first insulating layer and including a trench; a via hole formed in the trench over the first and second insulating layers and exposing a portion of the source electrode or the drain electrode; a first electrode disposed in the trench and connected to one of the source electrode and the drain electrode through the via hole; a pixel defining layer disposed on the first electrode and having an opening exposing the first electrode; an organic layer disposed in the opening and having at least an organic emission layer; and a second electrode disposed on an entire surface of the substrate having the organic layer.

In another exemplary embodiment of the present invention, a method of fabricating an OLED includes: preparing a substrate; forming a thin film transistor including source and drain electrodes on the substrate; forming a first insulating layer on the substrate including the source and drain electrodes; forming a second insulating layer on the first insulating layer; etching the second insulating layer not to expose the first insulating layer and forming a trench; etching the first and second insulating layers, and forming a via hole exposing a portion of the source electrode or the drain electrode in the trench; forming a first electrode in the trench to be connected to one of the source electrode and the drain electrode though the via hole; forming a pixel defining layer including an opening exposing the first electrode on the first electrode; forming an organic layer including at least an organic emission layer in the opening; and forming a second electrode on an entire surface of the substrate having the organic layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
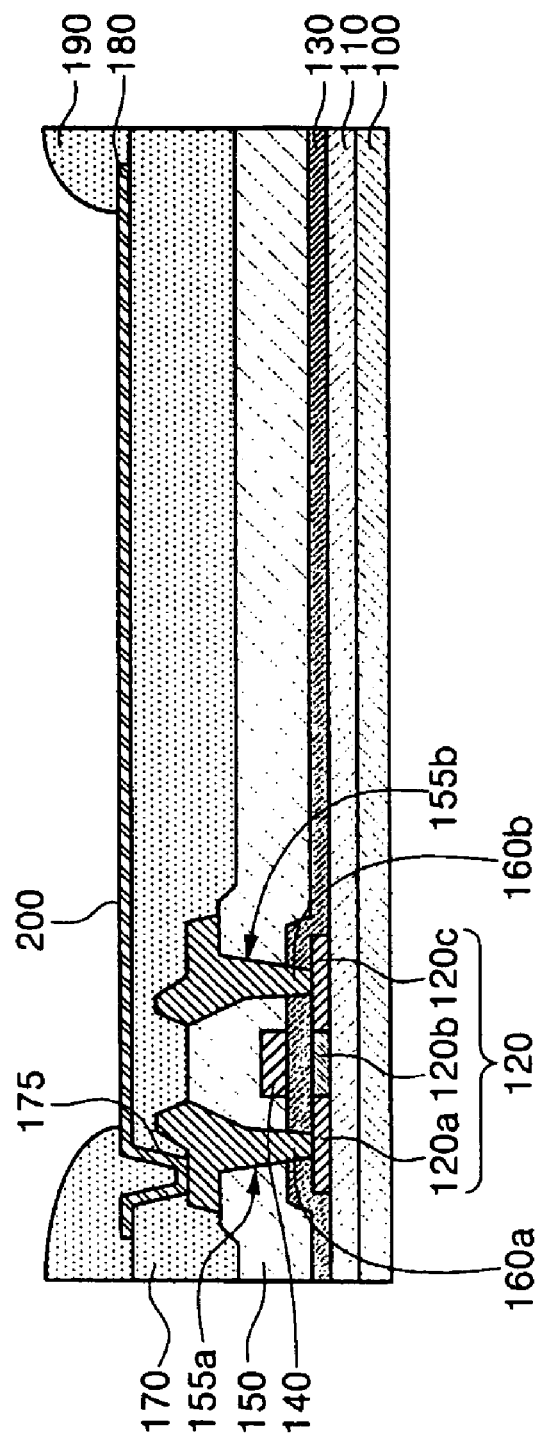
FIG. 1 is a cross-sectional view of a conventional organic light emitting display device (OLED)

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
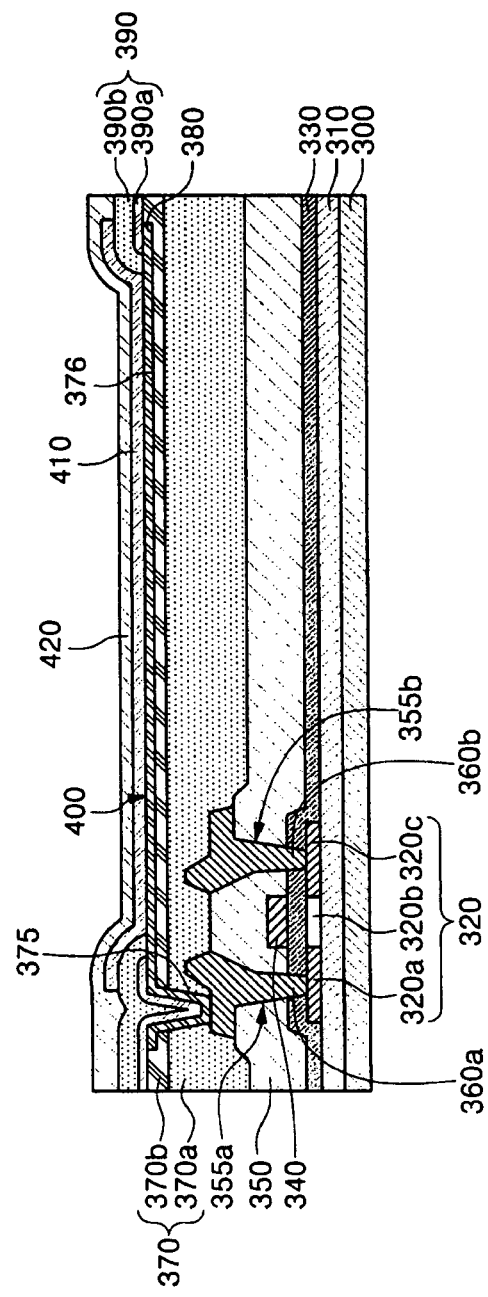
FIG. 2 is a cross-sectional view of an OLED according to an embodiment of the present invention.

FIG. 2 is a cross-sectional view of an organic light emitting display device (OLED) according to an exemplary embodiment of the present invention. Referring to FIG. 2, a buffer layer 310 is formed on a substrate 300 formed of glass or plastic. The buffer layer 310 protects a thin film transistor to be formed in subsequent processes from impurities such as alkali ions which tend to diffuse from the substrate 300, and is selectively formed of a silicon oxide layer ($SiO_2$), a silicon nitride layer (SiNx), or a silicon oxynitride layer (SiOxNy).

Subsequently, a semiconductor layer 320 having source and drain regions 320a and 320c and a channel region 320b is formed on the buffer layer 310. Preferably, the semiconductor layer 320 is formed by depositing an amorphous silicon layer on the buffer layer 310, crystallizing it using Excimer Laser Annealing (ELA), Sequential Lateral Solidification (SLS), Metal Induced Crystallization (MIC) or Metal Induced Lateral Crystallization (MILC), and then patterning it to form a polycrystalline silicon layer.

A gate insulating layer 330 is formed on the entire surface of the substrate having the semiconductor layer 320. The gate insulating layer 330 may be a silicon oxide layer, a silicon nitride layer or a stacked layer thereof. A gate electrode 340 is formed on a predetermined region of the gate insulating layer 330 corresponding to the semiconductor layer 320. The gate electrode 340 may be formed of one selected from the group consisting of aluminum (Al), an Al alloy, molybdenum (Mo), and a Mo alloy. Most preferably, the gate electrode 340 is formed of a molybdenum-tungsten (MoW) alloy.

An interlayer insulating layer 350 is formed on the entire surface of the substrate having the gate electrode 340. The interlayer insulating layer 350 is a silicon nitride layer or a silicon oxide layer and is formed to insulate the gate electrode 340 from source and drain electrodes 360a and 360b formed in subsequent processes. The interlayer insulating layer 350 and the gate insulating layer 330 are etched to form contact holes 355a and 355b exposing portions of the source and drain regions 320a and 320c.

Then, the source and drain electrodes 360a and 360b electrically connected to the source and drain regions 320a and 320c through the contact holes 355a and 355b are formed. The source and drain electrodes 360a and 360b are formed of a low-resistance material to reduce interconnection resistance, for example, Mo, W, MoW or Al.

A first insulating layer 370a is formed on the entire surface of the substrate having the source and drain electrodes 360a and 360b. The first insulating layer 370a is a planarization layer and may be formed of polyimide, a benzocyclobutene series resin, spin on glass (SOG) or acrylate, to a thickness of 0.5 to 1 μm.

A second insulating layer 370b is formed on the first insulating layer 370a. The second insulating layer 370b is formed of an inorganic material such as silicon nitride or silicon oxide. The second insulating layer 370b may be thickly formed compared to a trench 376 to be formed subsequently, so as not to expose the first insulating layer 370a by the trench 376.

Here, the inorganic second insulating layer 370b is formed on the first insulating layer 370a, which is an organic layer, thereby preventing outgassing of the first insulating layer 370a and pixel shrinkage. Also, since the inorganic second insulating layer 370b can bond strongly with an encapsulated substrate, it can effectively prevent penetration of air and moisture from the outside and thus increase a device's lifespan.

The second insulating layer 370b is etched to form the trench 376 defining a region where a first electrode 380 will be formed in the insulating layer 370. In order to reduce a step between the second insulating layer 370b and the first electrode 380, the trench 376 may be formed to the same thickness as the first electrode 380. Alternatively, the trench 376 may be formed to within the range of ½-½ the thickness of the first electrode 380.

Next, the first and second insulating layers 370a and 370b are etched to form a via hole 375 exposing a portion of the drain electrode 360a in the trench 376. The first electrode 380 is connected to the drain electrode 360a through the via hole 375 in the trench 376. The first electrode 380 includes a reflective layer formed of a metal having a high reflectance such as Al, Al—Nd and Ag on its lower layer, and is a transparent electrode having a thickness of 500 to 1500 Å on the reflective layer. Here, the first electrode 380 is formed in the trench 376, thereby reducing the step between the second insulating layer 370b and the first electrode 380, and thus the following pixel defining layer may be formed more thinly.

Subsequently, a pixel defining layer 390 having an opening 400 is formed on the first electrode 380. Here, the pixel defining layer 390 may be formed to include an inorganic first pixel defining layer 390a and an organic second pixel defining layer 390b.

To be specific, the first pixel defining layer 390a is formed on the first electrode 380 using an inorganic material such as silicon nitride or silicon oxide. The first pixel defining layer 390a may be thinly formed to enhance transfer efficiency of an organic layer to be formed subsequently by a LITI method, and is preferably formed to a thickness of 500 to 1000 Å. Then, the first pixel defining layer 390a is etched to form the opening 400 exposing the first electrode 380. The second pixel defining layer 390b is formed on the first pixel defining layer 390a using an organic material such as polyimide or an acryl series resin which has excellent filling ability, to cover the first pixel defining layer 390a. The second pixel defining layer 390b may be thinly formed to enhance transfer efficiency of the organic layer to be formed subsequently by a LITI method, and is preferably formed to a thickness of 1000 to 3000 Å. The second pixel defining layer 390b is exposed and developed to remove a portion of the second pixel defining layer 390b formed in the opening 400. Here, when the second pixel defining layer 390b is formed on the first pixel defining layer 390a, a crack which may occur at an edge of the first electrode and a periphery of the via hole owing to the low step coverage of the first pixel defining layer 390a which is an inorganic layer may be filled with the second pixel defining layer 390b. Also, in the formation of the organic layer by the LITI method, even if the second pixel defining layer 390b is damaged, a short circuit between the first and second electrodes can be prevented by the underlying hard first pixel defining layer 390a.

Subsequently, an organic layer 410 is formed in the opening 400. The organic layer includes at least an organic emission layer. Moreover, the organic layer 410 may further include at least one of a hole injection layer, a hole transport layer, an electron transport layer and an electron injection layer. The organic layer 410 may be formed by the LITI method, in which case the step between the pixel defining layer and the first electrode should be small to enhance transfer efficiency.

A second electrode 420 including a metal layer thinly formed of Mg, Ag, Al, Ca or an alloy thereof and a transparent conductive layer such as indium tin oxide (ITO) or indium-doped zinc oxide (IZO), is formed on the entire surface of the substrate having the organic layer, and thus an OLED is completed.

According to aspects of the present invention as described above, the inorganic second insulating layer 370b is formed on the organic first insulating layer 370a, thereby preventing outgassing of the first insulating layer, increasing bonding strength with an encapsulated substrate 406, and increasing the lifespan of a device. In addition, the first electrode 380 is formed in the trench 376 of the second insulating layer 370b to reduce the step between the first electrode 380 and the insulating layer 370, and thus the pixel defining layer may be formed thinner than a conventional pixel defining layer.

In an aspect of the present invention, the inorganic first pixel defining layer 390a is formed on the first electrode 380 and then the organic second pixel defining layer 390b is formed thereon to fill all cracks caused by imperfect step coverage of the first pixel defining layer 390a. Furthermore, even if the second pixel defining layer 390b sustains damage when a donor substrate is removed after transferring the organic layer 410, a short circuit between the first and second electrodes can be prevented by the underlying first pixel defining layer 390a.

The pixel defining layers 390 are thinly formed compared to a conventional pixel defining layer made of an organic material. The first pixel defining layer 390a has a thickness of 500 to 1000 Å and the second pixel defining layer 390b has a thickness of 1000 to 3000 Å. Thus, when the organic layer 410 is subsequently formed by the LITI method, transfer efficiency can be maximized.

Consequently, aspects of the present invention can prevent a pixel shrinkage phenomenon caused by outgassing and increase a device's lifespan by minimizing penetration of air and moisture from the outside. Also, the reliability of a device can be enhanced by maximizing the transfer efficiency of the organic layer by the LITI method and preventing an open defect of the organic layer.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display device (OLED), comprising:
    a substrate;
    a thin film transistor disposed on the substrate and including a source electrode and a drain electrode;
    a first insulating layer disposed on the substrate and the source and drain electrodes;
    a second insulating layer disposed on the first insulating layer and including a trench formed by reducing the thickness of a portion of the second insulating layer;
    a via hole formed in the bottom of the trench, through the first and second insulating layers, exposing the source electrode or the drain electrode;
    a first electrode disposed in the trench and connected to one of the source electrode and the drain electrode, through the via hole;
    a pixel defining layer disposed on the first electrode and having an opening exposing a portion of the first electrode;
    an organic electroluminescent layer disposed in the opening; and
    a second electrode disposed on an entire surface of the substrate having the organic layer, wherein,
    the opening has a first side wall and an opposing second side wall,
    the thin film transistor is disposed at the first side wall of the opening, and
    the trench extends continuously from the thin film transistor to the second side wall of the opening.

2. The OLED according to claim 1, wherein the first insulating layer is an organic layer.

3. The OLED according to claim 1, wherein the first insulating layer is formed of polyimide or polyacryl.

4. The OLED according to claim 1, wherein the second insulating layer is formed of silicon nitride or silicon oxide.

5. The OLED according to claim 1, wherein the trench is formed in the second insulating layer not to expose the first insulating layer and has a depth of $\frac{1}{2}$ to $\frac{3}{2}$ the thickness of the first electrode.

6. The OLED according to claim 1, wherein the pixel defining layer comprises:

an inorganic first pixel defining layer; and an organic second pixel defining layer disposed on the first pixel defining layer.

7. The OLED according to claim 6, wherein the organic second pixel defining layer is formed on the inorganic first pixel defining layer, so as to fill the via hole and surround an edge of the first electrode and a periphery of the via hole.

8. The OLED according to claim 6, wherein the inorganic first pixel defining layer has a thickness of 500 to 1000 Å, and the organic second pixel defining layer has a thickness of 1000 to 3000 Å.

9. The OLED according to claim 6, wherein the organic second pixel defining layer is formed of polyimide or polyacryl.

10. The OLED according to claim 6, wherein the inorganic first pixel defining layer is formed of silicon nitride or silicon oxide.

11. The OLED according to claim 1, wherein the organic layer disposed in the opening comprises at least one of a hole injection layer, a hole transport layer, an electron transport layer and an electron injection layer.

12. A flat panel display device comprising the OLED according to claim 1.

13. The OLED according to claim 1, wherein the second insulating layer is an inorganic layer.

14. An organic light emitting display device (OLED), comprising:

a thin film transistor disposed on a substrate;

an insulating layer covering the transistor, having a trench formed by reducing the thickness of a portion of the insulating layer;

a first electrode disposed in the trench, coupled to the thin film transistor, through a via hole formed in the bottom of the trench;

a pixel defining layer disposed on the first electrode, having an opening to expose a portion of the first electrode;

an organic electroluminescent layer disposed in the opening, on the first electrode; and a second electrode on the substrate, wherein all of the first electrode is disposed directly on the bottom of the trench, except for a portion of the first electrode that is disposed within the via hole.

15. An The OLED according to claim 14, wherein the pixel defining layer comprises:

an inorganic first pixel defining layer; and an organic second pixel defining layer disposed on the first pixel defining layer, to fill in cracks formed in the inorganic first pixel defining layer.

16. The OLED according to claim 14, wherein the insulating layer comprises:

an organic insulating layer covering the transistor; and an inorganic insulating layer covering the organic insulating layer, to prevent outgassing of the organic insulating layer;

wherein the trench is formed in the inorganic layer, and the via hole extends through both the organic insulating layer and the inorganic insulating layer.

* * * * *